United States Patent
Wang et al.

(10) Patent No.: US 12,040,897 B2
(45) Date of Patent: Jul. 16, 2024

(54) LEARNING-BASED HIGH-PERFORMANCE, ENERGY-EFFICIENT, FAULT-TOLERANT ON-CHIP COMMUNICATION DESIGN FRAMEWORK

(71) Applicant: The George Washington University, Washington, DC (US)

(72) Inventors: Ke Wang, Alexandria, VA (US); Ahmed Louri, Vienna, VA (US)

(73) Assignee: THE GEORGE WASHINGTON UNIVERSITY, Washington, DC (US)

(*) Notice: Subject to any disclaimer, the term of this patent is extended or adjusted under 35 U.S.C. 154(b) by 285 days.

(21) Appl. No.: 16/547,297

(22) Filed: Aug. 21, 2019

(65) Prior Publication Data

US 2020/0067637 A1    Feb. 27, 2020

Related U.S. Application Data

(60) Provisional application No. 62/853,455, filed on May 28, 2019, provisional application No. 62/720,634, filed on Aug. 21, 2018.

(51) Int. Cl.
*H04L 49/15* (2022.01)
*G06F 13/40* (2006.01)
(Continued)

(52) U.S. Cl.
CPC ........ *H04L 1/0057* (2013.01); *G06F 13/4027* (2013.01); *H03M 13/2906* (2013.01);
(Continued)

(58) Field of Classification Search
CPC .............. G06F 13/4027; H03M 13/09; H03M 13/2906; H03M 13/6306; H04L 1/0044;
(Continued)

(56) References Cited

U.S. PATENT DOCUMENTS

| 2008/0198786 A1* | 8/2008 | Nieto .................... H04L 1/0001 370/315 |
| 2010/0153822 A1* | 6/2010 | Huang .................. H04L 1/0057 714/776 |

(Continued)

OTHER PUBLICATIONS

H. Zheng et a., "EZ-Pass: An Energy & Performance-Efficient Power-Gating Router Architecture for Scalable NoCs", IEEE Computer Architecture Letters, vol. 17, No. 1, Jan.-Jun. 2018; pp. 88-91.
(Continued)

*Primary Examiner* — Derrick W Ferris
*Assistant Examiner* — M Mostazir Rahman
(74) *Attorney, Agent, or Firm* — BLANK ROME LLP

(57) ABSTRACT

A proactive fault-tolerant scheme which improves performance and energy efficiency for NoCs. The fault-tolerant scheme allows routers to switch among several different fault-tolerant operations. Each operation mode has different trade-offs among fault-tolerant capability, retransmission traffic, latency, and energy efficiency. Another example provides a proactive, dynamic control policy to balance and optimize the dynamic interactions and trade-offs. The example control policy uses example machine learning algorithm called reinforcement learning (RL). The example RL-based controller independently observes a set of NoC system parameters at runtime, and over time they evolve optimal per-router control policies. By automatically and optimally switching among the four fault-tolerant modes, the trained control policy results in minimizing system level network latency and maximizing energy efficiency while detecting and correcting errors.

26 Claims, 5 Drawing Sheets

(51) Int. Cl.
| | |
|---|---|
| *H03M 13/29* | (2006.01) |
| *H04L 1/00* | (2006.01) |
| *H04L 1/1867* | (2023.01) |
| *H04L 45/02* | (2022.01) |
| *H04L 47/125* | (2022.01) |
| *H04L 49/55* | (2022.01) |
| *H04L 49/90* | (2022.01) |

(52) U.S. Cl.
CPC .......... *H04L 1/0044* (2013.01); *H04L 1/1896* (2013.01); *H04L 45/08* (2013.01); *H04L 47/125* (2013.01); *H04L 49/15* (2013.01); *H04L 49/557* (2013.01); *H04L 49/90* (2013.01)

(58) Field of Classification Search
CPC ... H04L 1/0053; H04L 1/0057; H04L 1/1896; H04L 45/08; H04L 47/125; H04L 49/15; H04L 49/557; H04L 49/90; Y02D 10/00
See application file for complete search history.

(56) References Cited

U.S. PATENT DOCUMENTS

| | | | |
|---|---|---|---|
| 2011/0252284 A1* | 10/2011 | Sindhu | G06F 11/006 |
| | | | 711/170 |
| 2016/0182405 A1* | 6/2016 | Chen | H04L 49/109 |
| | | | 370/353 |
| 2018/0069706 A1* | 3/2018 | Dubrova | H04L 9/3236 |
| 2018/0091332 A1* | 3/2018 | Rothermel | H04L 1/0047 |
| 2019/0034268 A1* | 1/2019 | Roth | G11C 7/1006 |
| 2019/0116020 A1* | 4/2019 | Giaconi | H04L 49/30 |
| 2019/0260504 A1* | 8/2019 | Philip | H04L 1/0041 |

OTHER PUBLICATIONS

K. Wang, et al., "High-Performance, Energy-Efficient, Fault-Tolerant Network-on-Chip Design Using Reinforcement Learning", IEEE, 2019, 6 pgs.

* cited by examiner

LEARNING-BASED HIGH-PERFORMANCE, ENERGY-EFFICIENT, FAULT-TOLERANT ON-CHIP COMMUNICATION DESIGN FRAMEWORK

RELATED APPLICATIONS

This application claims the benefit of U.S. Provisional Application No. 62/720,634, filed Aug. 21, 2018, and U.S. Provisional Application No. 62/853,455, filed May 28, 2019. The entire contents of those applications are incorporated herein by reference.

This application is also related to the paper by K. Wang et al. entitled "High-Performance, Energy-Efficient, Fault-Tolerant Network-On-Chip Design Using Reinforcement Learning," Design, Automation & Test, Mar. 25-29, 2019, and to U.S. application Ser. No. 16/547,161, filed Aug. 21, 2019, based on U.S. Provisional Application No. 62/720,653, filed Aug. 21, 2018, and U.S. Provisional Application No. 62/853,418, filed May 28, 2019. The entire contents of the paper and applications are incorporated herein by reference.

GOVERNMENT LICENSE RIGHTS

This invention was made with Government support under Grant/Contract No. CCF1703013, CCF-1547034, CCF-1547035, CCF-1702980 awarded by National Science Foundation (NSF). The U.S. Government has certain rights in this invention.

BACKGROUND OF THE INVENTION

Field of the Invention

The present invention relates to router communications.

Background of the Related Art

The present invention generally relates to on-chip communication and more specifically to a high-performance, energy-efficient, and fault-tolerant interconnection architecture for parallel computing systems.

Network-on-chips (NoCs) are becoming the standard communication fabric for parallel computing architectures. As technology continues to scale, transistors and wires on the chip are becoming increasingly vulnerable to various fault mechanisms resulting in exacerbation of energy efficiency and performance for NoCs. Conventional fault-tolerant methods include both reactive techniques that passively respond to faults after they occur and proactive techniques that predict the occurrence of faults and mitigate those faults by deploying either load balancing or deflection routing techniques.

Reactive techniques rely on forward error detection/correction and packet retransmission which can lead to excessive power consumption, extra delays, additional hardware and chip area. Specifically, for example, constantly enabled static error detection/correction hardware results in excessive power consumption and degraded performance, while indiscriminately disabling error handling hardware can induce more errors and intrusive retransmission traffic. Proactive techniques, on the other hand, need to implement rules and strategies for prediction which can also occupy chip area and consume extra power.

SUMMARY OF THE INVENTION

The present invention presents a solution to simultaneously optimize performance, energy-efficiency, and reliability by balancing the trade-offs among error rate, packet retransmission, performance, and energy dynamically.

In one example, a router assembly has one or more power supplies, links, and control logic that connects to one or more components of the router, including error handling hardware. The circuit is configured to perform functions that comprise powering ON/OFF each component independently. For example, an Automatic Retransmission Query (ARQ) protocol with error correction codes (ECC) (ARQ+ECC) encoder and the ARQ+ECC decoder in one or more terminals can be switched ON to apply powerful error handling codes. They can also be powered OFF and bypassed to reduce latency and power consumption. The functions are controlled by the example fault-tolerant control module.

In another example, a method performed by a circuit comprises, based on an example control policy, circuit of a router dynamically deploys one of several example modes of operation for each router ports for the optimal performance. Each mode of operation comprises different error handling configurations including retransmission strategies, error mitigation techniques, error handling hardware, etc.

In yet another example, a circuit of a network-on-chip (NoC) architecture comprises a first router, a second router, and one or more communication links that communicatively couple the first router and the second router. The circuit is configured to perform functions that comprise the first router observing the operating attributes of itself and making a determination of the benefit of switching operation modes to achieve improved system-level performance. The functions further comprise, based at least in part of the determination, the links switching from operating in one of the modes to operating in another mode. In yet another example, a method is provided for controlling one or more communication links and router components. The method performed by each router comprises making operation modes switching decisions proactively, automatically, and optimally. An example method is using machine learning algorithms. An example machine learning algorithm is reinforcement learning.

The invention accordingly comprises the several steps and the relation of one or more of such steps with respect to each of the others, and the apparatus embodying features of construction, combinations of elements and arrangement of parts that are adapted to affect such steps, all is exemplified in the following detailed disclosure, and the scope of the invention will be indicated in the claims.

These and other objects of the invention, as well as many of the intended advantages thereof, will become more readily apparent when reference is made to the following description, taken in conjunction with the accompanying drawings.

DETAILED DESCRIPTION OF THE INVENTION

Figure 1:
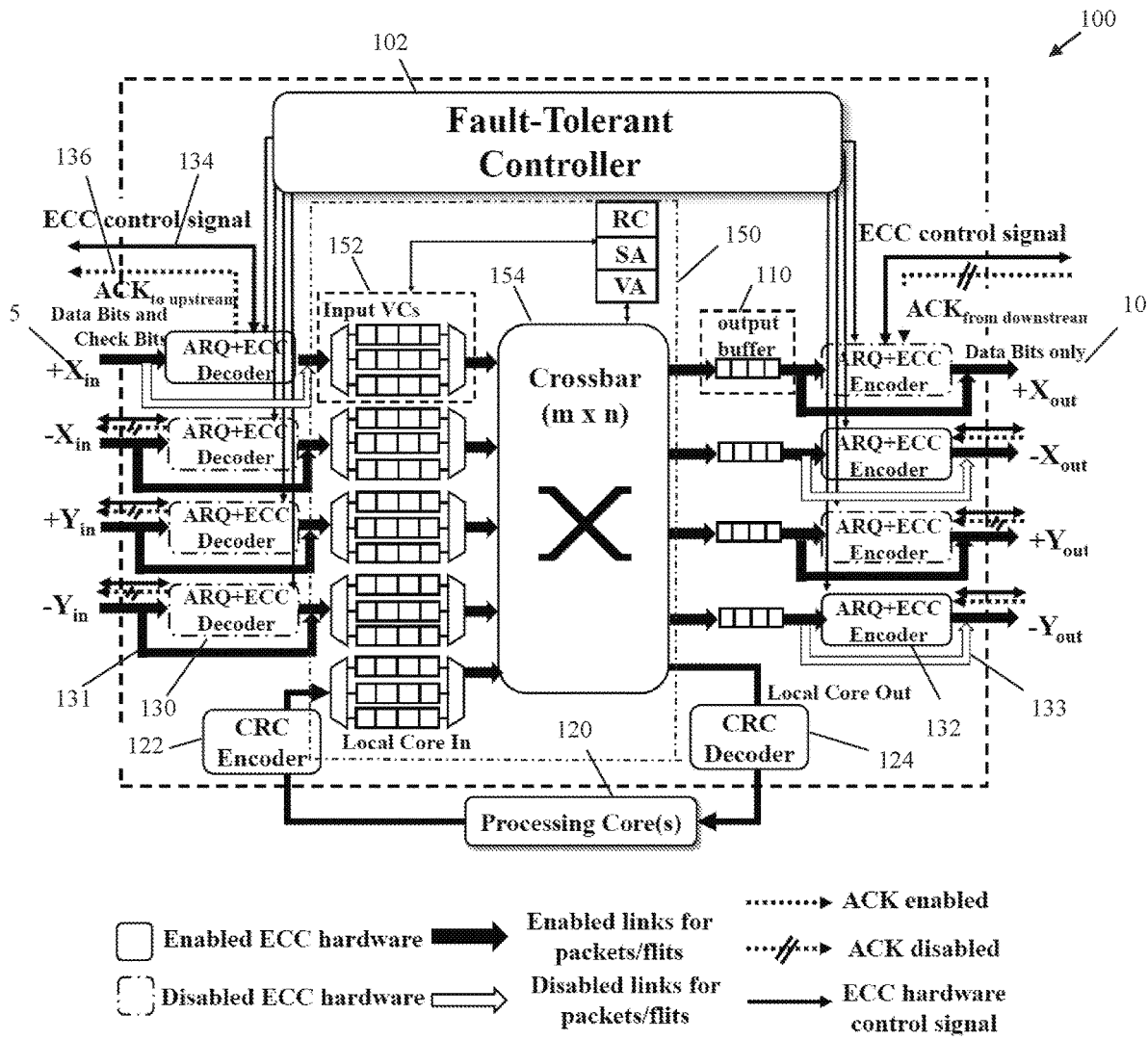
FIG. 1 illustrates an example router embodiment of a network-on-chip architecture.

In describing the illustrative, non-limiting embodiments of the invention illustrated in the drawings, specific terminology will be resorted to for the sake of clarity. However, the invention is not intended to be limited to the specific terms so selected, and it is to be understood that each specific term includes all technical equivalents that operate in similar manner to accomplish a similar purpose. Several embodiments of the invention are described for illustrative purposes, it being understood that the invention may be embodied in other forms not specifically shown in the drawings.

FIG. 1 illustrates a non-limiting example fault-tolerant switching device or router assembly 100 which is capable of dynamically enabling/disabling ARQ+ECC hardware. The fault-tolerant router assembly 100 includes a switching device 150, a per-router fault-tolerant controller 102, and output flit buffers 110. Also shown are input 5, output 10, input ARQ+ECC Decoders 130, output ARQ+ECC Encoders 132, processing core(s) 120, Cyclic Redundancy Check (CRC) Encoder 122, and CRC Decoder 124.

The router 150 can be any suitable switching element such as conventional router or other electronic component. In the example shown, the router 150 has routing control logic (Routing Computation (RC), Switch Allocation (SA), Virtual Channel Allocation (VA)), a set of input terminals (ports), an input register or buffer 152, an interconnection device such as a crossbar 154, and a set of output terminals (ports). The input buffers 152 each have a buffer multiplexer with a single buffer input and multiple multiplexer outputs, and a buffer demultiplexer with multiple demultiplexer inputs and a single buffer output. A plurality of Virtual Channels (VCs) are located between the buffer multiplexer and buffer demultiplexer that receive the multiple multiplexer outputs and form the multiple demultiplexer inputs. The crossbar 154 receives the buffer output from each of the respective input buffers 152.

The ARQ+ECC Decoders 130 each receive an input signal 5 and have a decoder output that is transmitted to and received by the buffer input of a respective buffer 152. In a NoC, data is transmitted in the form of packets, which are segmented into several flits. When the router 100 propagates a flit to the downstream router 100, it will first encode the flit with the ARQ+ECC encoder 132 and attach a hamming code (data check bits) to the flit. The downstream router decodes the received flit with the ARQ+ECC decoder 130 to check using the check bits. If the received data is correct, it will send an ACK back. Otherwise, a NACK will be sent back to the upstream router.

The ARQ+ECC Encoders 132 each receive a respective output from the output buffer 110 and provide the assembly output 10. The output buffer 110 is for storing a copy of the transmitted flit. Once the router receives an ACK from the downstream router, it will release (delete) the flit in the output buffer. If a NACK is received, the copy stored in the output buffer will be propagated to the downstream router (retransmission). The processing core 120 has a CRC Encoder 122 and CRC Decoder 124. The CRC Decoder 124 is connected to the crossbar 154 and receives an output from the crossbar 154, and provides it to the processing core 120. The CRC Encoder 124 is connected to the connected to the input router buffers 152, receives a control signal from the processing core 120 and feeds it to the input router buffers 152.

One terminal of the input terminals of the buffers 152, called local core input port, is connected to the local processing unit 120 via the CRC encoder 122, while the rest of the terminals are connected to the communication channel to other routers. One terminal of the output terminals of crossbar 154, called local core output port, is also connected to the local processing unit 120, while the rest of the terminals are connected to the communication channel to other routers 100. The error control hardware (i.e., the ARQ+ECC Decoders 130 and ARQ+ECC Encoders 132) is located in each port.

In accordance with one non-limiting example of the invention, one basic soft error tolerant technique is to apply error detection at the local core input/output ports of the routers. It should be noted that a transmission can involve several routers: source router, destination router, and intermediate routers (none, or one, or many). First, the packet is injected to the source router from the local core, via the CRC Encoder 122, to output ports of the buffer 110, to the ARQ+ECC Encoder 132, and the router output 10. And the packet is transmitted via any intermediate routers (via ARQ+ECC Decoder 130, input buffers 152, crossbar 154, output buffer 110, and ARQ+ECC Encoder 132). When it reaches the destination router, it is sent through the crossbar 154 to the Processing Core 120 of the destination router via the CRC Decoder 124. CRC is only applied in the CRC Encoder 122 of the source router and the CRC Decoder 124 of the destination router.

For example, Cyclic Redundancy Check (CRC) can be provided, which is an error checking algorithm to detect accidental changes to raw data. As noted, in a CRC-enabled NoC system, each flit of a packet is encoded with a CRC encoder 122 before its injection into the source router. Each packet has 4 flits. CRC is only for local core ports 122, 124. Each port, at input buffer 152, has several (usually 4) virtual channels (VC). Each VC can hold several flits (usually 4).

The flits are then decoded by a CRC decoder 124 of the destination router. If the flit fails to pass CRC, a retransmission request is sent by CRC decoder 124 to the source router, and the entire packet will be retransmitted from the source. A flight might fail, for instance, if the CRC code (that is attached to the flit using some algorithm) no longer matches the data bits. When the CRC decoder 124 checks the attached code, it will know if the code and data bits match. If there is no match, the CRC decoder 124 determines a fail. Such retransmission scheme is inefficient since a fault can only be detected at the destination router. In accordance with the invention, operation modes (discussed below) that activates the ARQ+ECC hardware is more efficient, since it allows retransmission from an adjacent upstream router, instead of from the source router.

The CRC encoder 122 and CRC decoder 124 is always enabled. However, only a source node encodes, at the CRC encoder 122, the packet, which is injected from the local core input port of the source node, and only a destination node decodes, at CRC decoder 124, the packet ejected to the local core output port. So when the source node is ready to transmit information, the CRC encoder 122 encodes that data and transmits it via the crossbar 154 to the output 10. The destination router receives that data at the input 5, and the CRC decoder 124 decodes the data. If the CRC decoder 124 detects error, it sends a request for retransmission to the source node to retransmit the data. Any intermediary router 100 that receives the data, will neither encode nor decode that data.

In addition, in other terminals/ports, a stronger error tolerant hardware can be provided. An example of a stronger error tolerant technique is to use the Automatic Retransmission Query (ARQ) protocol with error correction codes (ECC). ARQ+ECC is an error detection and retransmission method that relies on sending error checking result messages 136, in the form of acknowledgement signal (ACK) signals, between any two adjacent routers.

The ARQ+ECC encoder 132 is provided at each output port 10, while the ARQ+ECC decoders 130 are provided at the input ports 5. The ARQ+ECC adds error checking bits to flits to provide the function of single-bit error correction and double-bit error detection (SECDED) by the ARQ+ECC Decoder 130 of the downstream router. The ECC control signal 134 is used to synchronize the ARQ+ECC encoder 132 and decoder 130 in the same channel (as they have to be active or deactive simultaneously). When the controller 102 enables the ARQ+ECC encoder 132, the ARQ+ECC encoder 132 generates the ECC control signal 134 and send it to the downstream router to synchronize with the ARQ+ECC decoder 130 in the downstream router.

When a flit is transmitted from the current router to the downstream router, a copy of that flit is buffered in the current router's virtual channel (VC) 152 until it receives an ACK message 136 (acknowledgement) of NACK (non-acknowledgement) back from the downstream router 100. If a negative-acknowledgement (NACK) 136 is received, the buffered flit is retransmitted to the downstream router 100, and that repeats until an ACK is received. The present invention dynamically enables/disables the ARQ+ECC hardware, namely ARQ+ECC decoder 130 and ARQ+ECC encoder 132, controlled by the example fault-tolerant control module 102.

Accordingly, the controller 102 transmits a control signal to a upstream router to turn OFF its ARQ+ECC encoder 132, and transmits a control signal to a downstream router to turn ON its ARQ+ECC decoder 132. The controller 102 also receives a control signal from a upstream router and turns OFF its ARQ+ECC decoder 132 in response, and receives a control signal from a downstream router turns ON its ARQ+ECC encoder 132 in response. Thus, in a given router R1 (assuming its downstream router is R2, and its upstream router is R0), the controller 102 of R1 transmits a control signal to the R1 ARQ+ECC decoder 132, and the R1 ARQ+ECC decoder 132 sends the ECC control signal 134 to the downstream router R2 to turn ON/OFF the downstream router R2's ARQ+ECC decoder 130. The router R1's ARQ+ECC decoder 130 receives router R0's ECC control signal 134 generated by router R0's ARQ+ECC encoder 132 (originally controlled by router R0's controller 102) and turns ON/OFF router R1's ARQ+ECC decoder 130.

At each output port, there is a 1-flit output buffer 110. The output buffer 110 holds a copy of the original flit from the upstream router (if the current router is an intermediate router), or from local core (if the current router is the source router). Once the ARQ+ECC encoder 132 receives an ACK from the downstream router, the output buffer 110 releases (deletes) the flit in the output buffer 110. If a NACK is received, the copy stored in the output buffer 110 is retransmitted to the downstream router. In FIG. 1, all of the ARQ+ECC decoders 130 send ACK/NACK 136 to the upstream routers' ARQ+ECC encoders 132 (in four directions). All the ARQ+ECC encoders 132 can receive ACK/NACK 136 from the downstream routers' ARQ+ECC decoders 130.

Figure 2A:
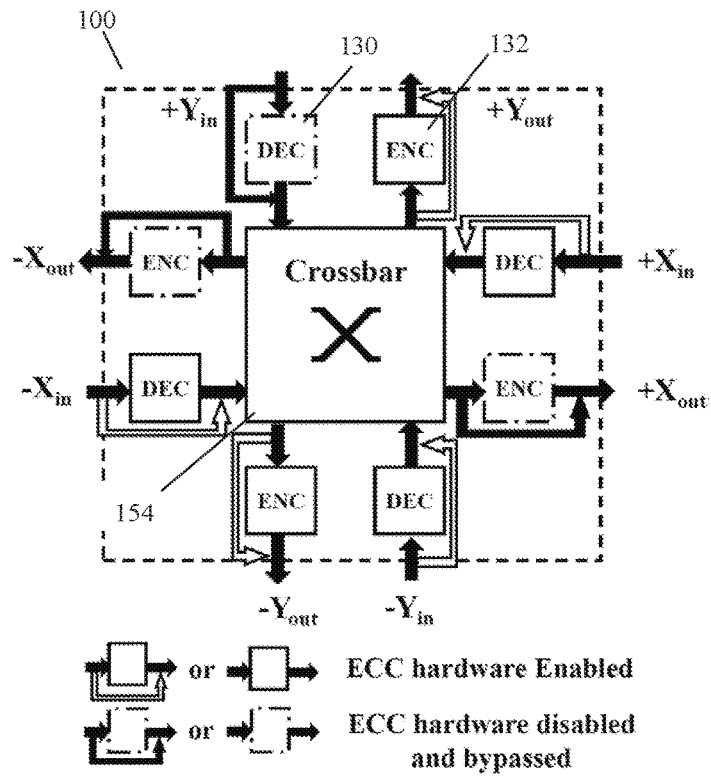
FIG. 2(a) is a simplified block diagram illustrating example router embodiment.
Figure 2B:
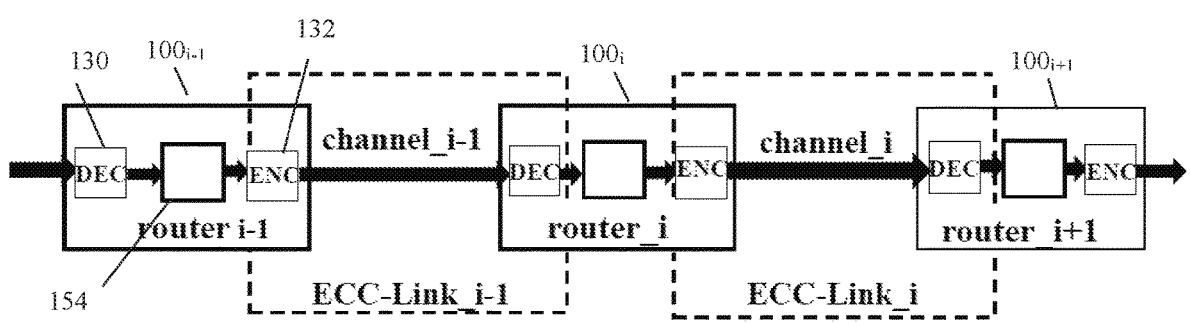
FIG. 2(b) illustrates an example communication channel that includes communication links between routers and example error control circuits.

FIG. 2 shows a simplified router assembly diagram of FIG. 1, wherein only the ARQ+ECC Decoders (DEC) 130 and ARQ+ECC Encoders (ENC) 132 are shown. FIG. 2(a) shows the overall architecture of a single router assembly 100. FIG. 2(b) shows communications between neighboring router assemblies including the current router 100$i$, the prior or upstream router 100$_{i-1}$ that transmits to the current router 100$i$, and the next or downstream router 100$_{i+1}$ that receives from the current router 100$i$. Here, the channel from the current router i to the downstream router i+1 is defined as channel i. The ARQ+ECC-Link i has the ARQ+ECC encoder 132 of the current router i and the ARQ+ECC decoder of the downstream router i+1.

Enabling the ARQ+ECC-Link i means that both the ARQ+ECC encoder 132 of the current router i and the ARQ+ECC decoder of the downstream router i+1 are switched ON, as controlled by the fault-tolerant controller of router i. Disabling the ARQ+ECC-Link i means that both the ARQ+ECC encoder 132 of the current router i and the ARQ+ECC decoder of the downstream router i+1 are powered OFF and bypassed, as also controlled by the fault-tolerant controller of router i. For example, in FIG. 2(a), the DEC 130 at the top, the ENC 132 at the left, and the ENC 132 at the right, are all disabled and bypassed, and the other DECs 130 and ENCs 132 are enabled.

As shown in FIG. 1, a decoder bypass route 131 is provided at the ARQ+ECC decoder 130, that connects at the input and output sides of the ARQ+ECC decoder 130. And an encoder bypass route 133 is provided at the ARQ+ECC encoder 132, that connects at the input and output sides of the ARQ+ECC encoder 132. When the bypass routes 131, 133 are shown by a dark solid filled arrow, the bypass route 131, 133 is enabled and the ARQ+ECC encoder 130 or decoder 132 is disabled and bypassed (and the encoder 130 or decoder 132 are shown in dashed line). Thus, data goes directly from the input port 5 to the local input buffer 152, or from the output buffer 110 to the output port 10, without any ARQ+ECC processing. When the route 131, 133 is shown as a hollow white arrow, the bypass route 131, 133 is disabled and the ARQ+ECC decoder 130 or encoder 132 is enabled (and the decoder 130 or encoder 132 is shown in solid line). Thus, data passes to the ARQ+ECC decoder and encoder 130, 132 for ARQ+ECC processing. The bypass routes 131, 133 and decoder/encoder 130, 132 are turned ON/OFF by the controller 102, which can activate a switch located at an input to the bypass route 131, 133 to direct data to the bypass route 131, 133 or the decoder/encoder 130, 132. The switch is used to enable/disable the ECC hardware. An example of the switch connected to the power/voltage supply to power ON/OFF the ECC hardware.

In FIG. 1, the decoder bypass route 131 for input $+X_{in}$ is disabled, and the associated ARQ+ECC decoder 130 is enabled. The decoder bypass routes 131 for inputs $-X_{in}$, $+Y_{in}$, $-Y_{in}$ are enabled, and the associated ARQ+ECC encoders 132 are disabled. In addition, the encoder bypass routes 133 for outputs $-X_{out}$ and $-Y_{out}$ are enabled, and the associated ARQ+ECC encoders 132 are disabled. The encoder bypass routes 133 for outputs $+X_{out}$ and $+Y_{out}$ are enabled, and the associated ARQ+ECC encoders 132 are disabled.

Referring to FIG. 3, the fault-tolerant router dynamically deploys one of four proposed fault-tolerant operation modes 0-3, shown respectively in FIGS. 3(a)-3(d), assigned for four different situations with various error levels on each link by the associated router, for optimal performance. FIG. 3(e) shows the legend for FIGS. 3(a)-3(d). In all modes, the CRC encoder 122 operates at the source router, and the CRC decoder 124 operates at the destination router.

Figure 3A:
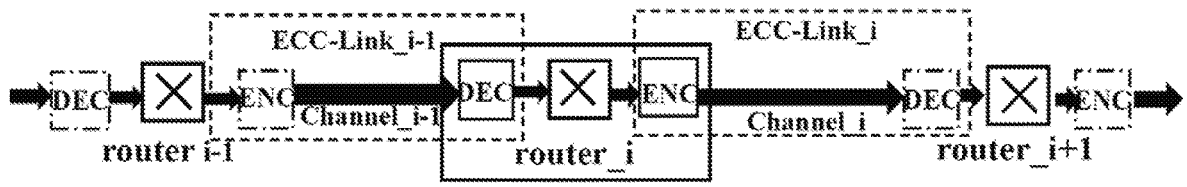
FIG. 3(a) illustrates a first mode of operation for an example embodiment of a communication channel.

Turning first to FIG. 3(a), the first Operation Mode 0 is for a minimum error level. Here, there is a minimum possibility that transmitted flits would contain faults. Therefore, the overhead of deploying channel i ARQ+ECC hardware is larger than the overhead of possible packet retransmission when ARQ+ECC hardware is disabled. In this case, ARQ+ECC-Link i and ARQ+ECC-Link i−1 are disabled and bypassed by router i to save power and reduce latency. Full packet retransmission from the source router is also enabled.

Figure 3B:
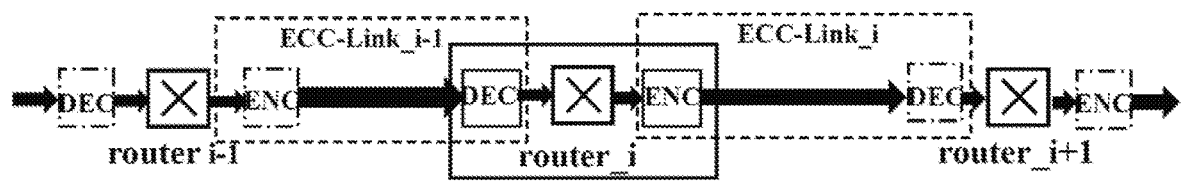
FIG. 3(b) illustrates a second mode of operation for an example embodiment of a communication channel.

FIG. 3(b) shows the second Operation Mode 1, for low error level. Here, the overhead of enabling channel i ARQ+ECC hardware is smaller than the packet retransmission when ARQ+ECC hardware is disabled. Nevertheless, most of the faults will be corrected by SECDED of the ARQ+ECC decoder and encoder 130, 132. In the example shown, the ARQ+ECC decoder and encoder 130, 132 apply SECDED. However, the ARQ+ECC decoder and encoder 130, 132 can also apply other codes, such as DECTED (double error correction, triple error detection), etc. In this mode, router i enables ARQ+ECC-Link i to avoid full packet retransmission and consequently reduces power and latency. However, flit retransmission from the upstream node can occur if a NACK is received. The ARQ+ECC-Link i−1 is disabled. The link i−1 is disabled, but link i is enabled since there is no error in link i−1, and there is error in link i. This is an example that ECC of different links can be enabled/disabled independently.

Figure 3C:
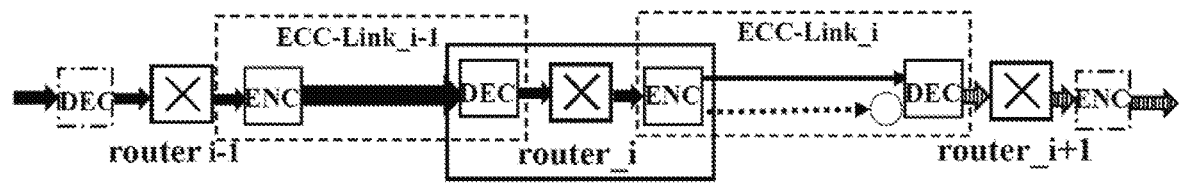
FIG. 3(c) illustrates a third mode of operation for an example embodiment of a communication channel.

FIG. 3(c) shows the third Operation Mode 2, for medium error level. This is the situation wherein the faults on channel i will not be corrected by the downstream ARQ+ECC decoder and encoder 130, 132, and a flit retransmission from router i is required. In this case, router i anticipates a NACK message from router i+1 requiring retransmission of the flit. It anticipates a NACK because it predicts a high error rate in link i, therefore there is a high probability that a retransmission is needed. Some state attributes will trigger this, for example, high temperature of the router i. Instead of waiting for the NACK, router i pre-transmits the flit ahead of time (1 clock cycle after propagating the original flit, the router i send another copy as a pre-retransmission) to save the round-trip flit transmission time in channel i, which is referred to here as flit pre-retransmission. To differentiate the transmission and pre-retransmission of the flit, we insert a one-clock-cycle delay between the two. Both ARQ+ECC-Link i−1 and ARQ+ECC-Link i are enabled, flit pre-retransmission occurs from the current router i to the downstream router i+1, and 1 clock cycle delay is inserted between pre-retransmitted flit and original flit.

Figure 3D:
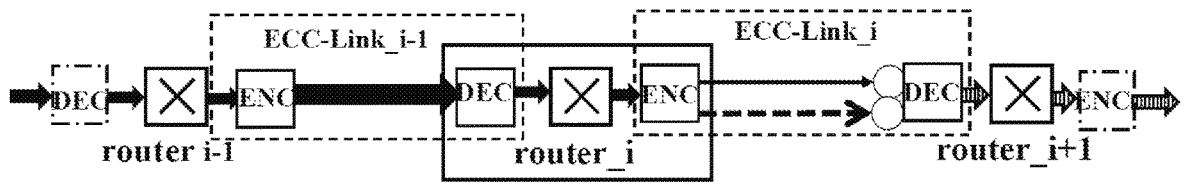
FIG. 3(d) illustrates a fourth mode of operation for an example embodiment of a communication channel.
Figure 3E:
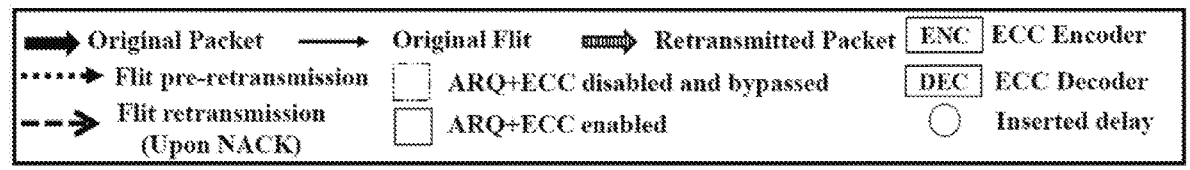
FIG. 3(e) is the legend for FIGS. 3(a)-3(d)

FIG. 3(d) shows the fourth Operation Mode 3, for high error level. This is the situation where the errors in transmitted flits will not be corrected by downstream ARQ+ECC hardware, and the retransmitted flits will still contain faults. For example using RL, the state will show that taking operation mode 3 has the maximum benefit, which indicates that the errors will not be corrected by other modes. In another example using decision trees as machine learning algorithm, it will predict a very high error rate.

In this case, two extra clock cycles are inserted before any flit transmission. The upstream router i first uses one clock cycle to send a control signal to downstream router i+1 informing router i+1 to stall an additional cycle before receiving any incoming flits. Flit will be sent via channel i after the delay. This will relax the timing constraint on the flit transmission and reduce the probability of timing error near to zero, and retransmissions are eliminated since it is not needed. Thus, ARQ+ECC-Link i−1 and ARQ+ECC-Link i are enabled, there is no flit pre-retransmission from the current router i to the downstream router i+1, and 1 clock cycle delay is inserted before any flit transmission.

The dynamic selection of operation modes is performed by each router assembly 100 independently yet simultaneously, in a sequence of discrete time steps, using an example reinforcement learning (RL) based control policy. At each time step, each router assembly 100 decides which operation mode to apply for the following time step and passes the decision to the downstream router. By doing so, the downstream router will be informed to configure the ARQ+ECC decoder located in the corresponding input port to apply the correct ARQ+ECC coding, so that it is synchronized with the ARQ+ECC coding of the upstream router's encoder at output port at the next time step. As demonstrated, the proposed dynamic per-router error detection/correction and power-gating scheme provide a higher degree of freedom for individual routers to apply the best strategy at a given time, resulting in greater benefits for the entire network.

Note that the design of operation modes can be different as described above. For example, other operation modes, such as double-error-correction triple-error-detection (DECTED), can also be applied to the system for fine-grain optimization.

Figure 4:
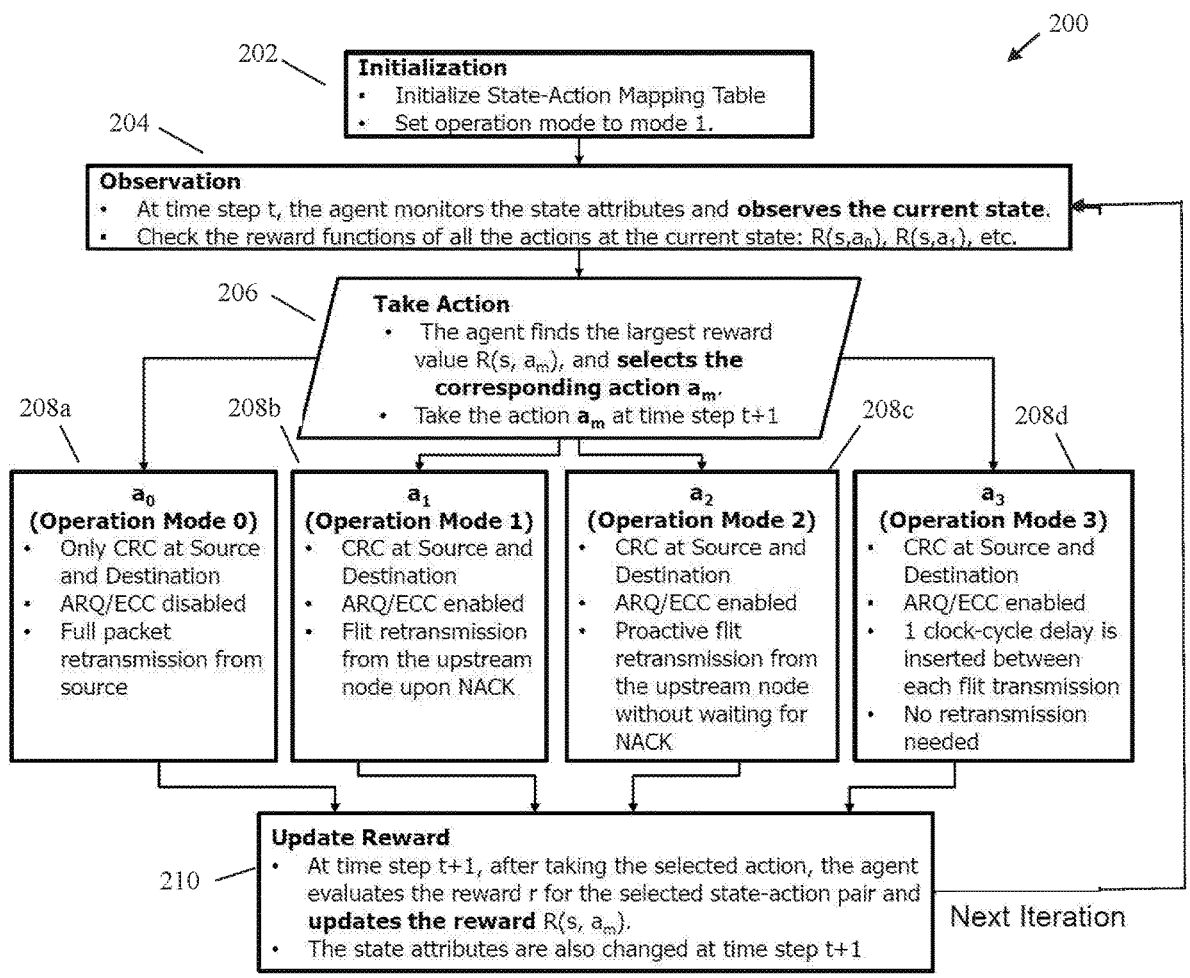
FIG. 4 is a block diagram depicting an example method.
Figure 5:
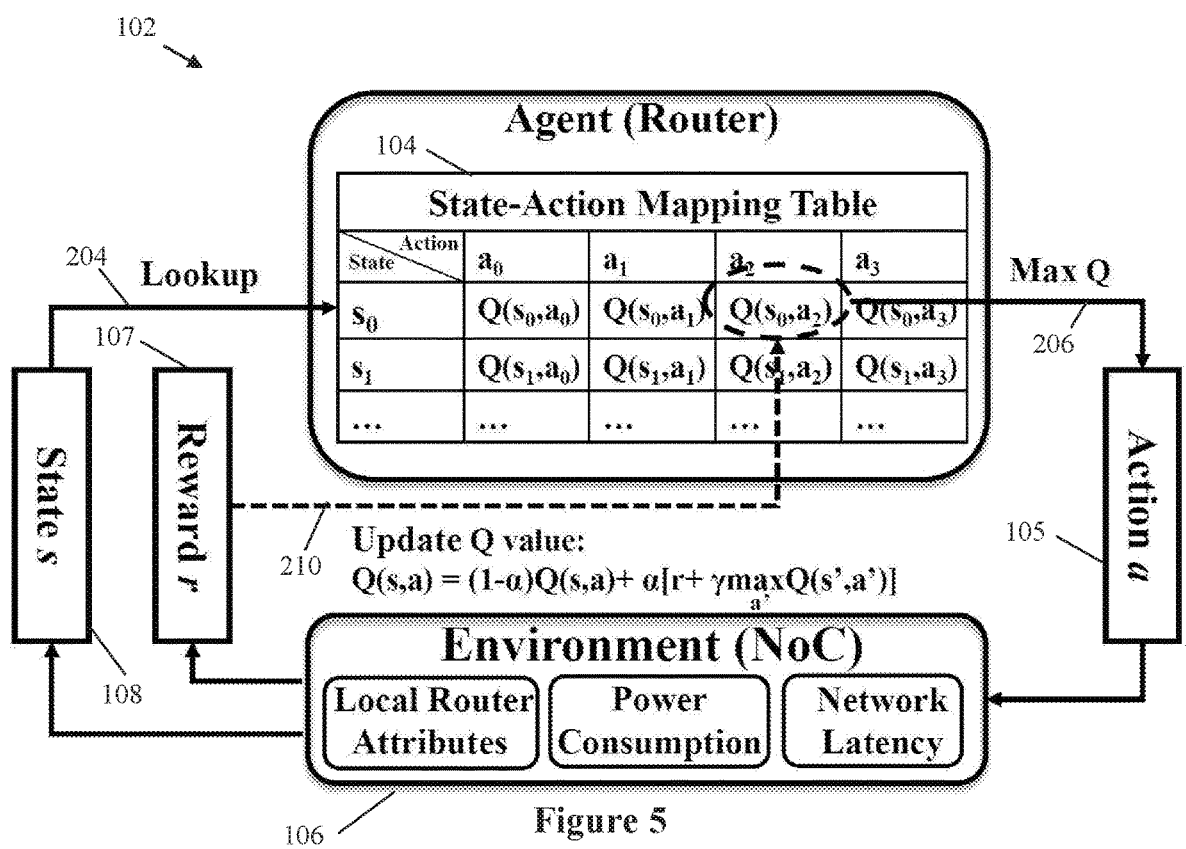
FIG. 5 is a diagram illustrating an example machine learning based control policy for an example method using reinforcement learning.

FIG. 4 illustrates the operation 200 of the machine learning (ML)-based controller 102 (FIG. 1) in each router assembly 100. The controller 102 can use machine learning algorithms other than Reinforcement Learning (RL), such as for example decision trees, artificial neural networks, etc. FIG. 5 shows detail of the controller 102 of FIG. 1, having a state-action mapping table 104, action a 105, environment NoC 106, reward r 107 and state s 108.

FIGS. 4, 5 provide a non-limiting example of the invention. Each example NoC router assembly 100 acts as a learner and a decision maker and interacts with the entire NoC system in a sequence of discrete time steps. At each time step, the router observes the current states by extracting runtime system metrics, selects one mode from the example proposed operation modes, and applies it at the next step. A state s is a vector of system attributes values. The state space for each router can be several network related metrics, such as shown in Table 1 below. Features 1 to 5 have five separate values each, representing the ports in each of the five directions. The action space A={$a_0$, $a_1$, $a_2$, $a_3$} contains the four fault-tolerant operation modes. According to the table 104, the controller 102 will select the best action (taking one of the operation modes 0-3) for the given state.

TABLE 1

| | Features (state attributes) | Descriptions |
|---|---|---|
| 1 | Input buffer utilization | Number of occupied input VCs |
| 2 | Input link utilization | Input flits/cycle for each port |
| 3 | Output link utilization | Output flits/cycle for each port |
| 4 | Input NACK rate | Percentage rate of NACK received |
| 5 | Output NACK rate | Percentage rate of NACK sent |
| 6 | Temperature | Local router temperature (Celsius) |

At the following time step, upon taking the action, the NoC metrics change and result in a new state, which is fed back to the agent. In addition to observing the new state, the agent also receives a reward (a function of objectives including energy, performance, reliability, etc.), representing the impact of the action on system performance. A policy maps states and actions, specifying how to choose actions given the state of the environment, which is represented in a State-Action mapping table 104 (FIG. 5). In one embodiment of the invention, the table 104 is stored in a storage device (such as a DRAM) at or in communication with the controller 102.

In RL, the goal of an RL agent is to optimize its long-term return, i.e. the discounted sum of future rewards. The return at time step t is therefore defined in Equation (1) as:

$$G_t = r_{t+1} + \gamma r_{t+2} + \gamma^2 r_{t+3} + \ldots = \sum_{k=0}^{\infty} \gamma^k r_{t+k+1} \qquad (1)$$

The variable $\gamma$ (where $0 \le \gamma \le 1$) in this equation is a discount rate which determines the impact of future rewards on the total return: as $\gamma$ approaches 1, the agent becomes less near-sighted by giving increasing weight to future rewards.

Action-Value Function and Q-learning. In RL, a model of the environment characterizes how the state of the environment changes as a result of an agent action, and the reward that the agent receives after each action. Correspondingly, RL agents compute an action-value function $Q^\pi(s, a)$ that captures the return they are expected to receive in this model of the environment if they start in state s, take action a, and follow the policy $\pi$ for the remaining actions.

In this invention, we use the tabular Q-learning algorithm to find the optimal Q-value function. A Q-value table is initialized with zeros for all possible (s, a) pairs. At each time step, the Q-learning algorithm chooses actions, based on the current Q, such that, over many time steps, all actions are taken in all states. In each time step, after taking an action a and observing the reward r and new state s', the action-value table entry Q(s, a) is changed using the following temporal difference rule of Equation (2):

$$Q(s, a) = (1 - \alpha)Q(s, a) + \alpha\left[r + \gamma \max_{a'} Q(s', a')\right] \qquad (2)$$

The learning rate a can be reduced over time and determines how well Q-learning will converge. Giving an appropriate value of $\alpha$, Q-learning can converge to the optimal Q-value function Q* and its corresponding optimal policy $\pi$*.

The goal of the Reinforcement Learning (RL) algorithm is to learn a policy that maximizes the agents long-term return, i.e., to maximize the total reward, which can be to minimize end-to-end packet latency and the router's power consumption. Thus, the immediate reward r for each router i is shown in Equation (3):

$$r = [E2E\_Latency(i) \times PowerConsumption(i)]^{-1} \qquad (3)$$

At step 202, all the router assemblies 100 in the NoC system are initialized to an initial mode, and the state-action mapping table 104 (FIG. 5) is initialized with an initial value (for example 0). At step 204, at each time step, the RL-based controller 102 in each router assembly 100 monitors the system attributes 106 and observes the current state 108. For example, attributes like buffer utilization and link utilization can be known using a local router buffer state table. Temperature is obtained by the local temperature sensor. The local router attributes (an example) monitored are listed in Table 1 above.

For the Environment NoC 106, local router attributes include: the buffer 152 utilization, link 5 utilization, output link 10 utilization, NACK 136 rate, and temperature. Power consumption is the static and dynamic power consumption of 100. Network latency means average end-to-end latency of each packet, meaning how many clock cycles from packet injection at source node to it is received correctly by the destination node.

Using the observed state 108, the controller 102 looks up that state 108 in the state-action table 104 and finds the largest reward 107, step 206. In the example shown in FIG. 5, the controller 102 determines that the router assembly 100 is in state s0, step 204. For example, it uses system attributes like buffer utilization, link utilization, etc. Each state is a combination of all those attribute values. For instance, State s0 is: +x buffer utilization level is 0, and −X buffer utilization level 0 . . . +x link utilization is level 0, . . . , temperature level is 1.

Referring to Table 1 above, there are total of 24 features, or state attributes. That is because there are input buffers for four input ports 5 and a local core input port; there are 5 input links, there are 5 output links, 4 input NACK directions, 4 output NACK directions, and 1 temperature value. Therefore 5+5+5+4+4+1=24 total attributes. Each attribute has several different values (in our example, the input buffer utilization is 0,1,2,3,4; link utilization is 0,1,2,3,4 . . . ). Each unique combination of all the attributes (a vector) is a state. For instance, S0={0,0,0,0,0 . . . 0,0,1}, S1={0,0,0,0,0 . . . 0,0,2}, . . . Sx={$x_1,x_2,x_3,x_4$, . . . ,$x_{24}$} . . . .

The controller 102 then looks up that state s0 in the table 104 and finds the largest reward 107 associated with the s0 state, shown as Q($s_0$, $a_2$) in FIG. 5. For example, the largest reward can mean the "highest Q (s,a) value in the S0 entry". For instance, Q(s0,a2) is larger than other Q (s0, any a).

The controller 102 then selects the corresponding action a 105 associated with the identified reward in the table 104, where the action a corresponds to one of the modes 0-3 of FIGS. 3(a)-3(d). In the example of FIG. 5, the largest reward Q($s_0$, $a_2$) is associated with action $a_2$. Also at step 206, at the beginning of the next time step t+1, the controller 102 takes the selected action $a_0$-$a_3$, steps 208a-208d (FIGS. 3(a)-3(c)), by configuring the corresponding components (decoder, encoder 130, 132), such as to disable and bypass certain components and enable other components. The router assembly 100 then updates the reward value, step 210, using the new system attributes.

For example, the new network latency and power consumption is monitored. An immediate reward r is calculated using latency and power consumption values. The new Q-value is updated using the immediate reward r with Equations (2), (3). The table is stored in the local storage of each router 100. An example of storage technique is using DRAM. Note that RL is only an example of machine learning algorithms. Other machine learning algorithms such as supervised learning, decision trees, neural networks, deep learning, etc. can also be applied to the ML-based controller. The table 104 is updated once at each time step. A time step can be 100, 500, or 1000 clock cycles for fine grain configuration, or 10K, 100K clock cycles to reduce timing overhead of dynamic configuration. The system is dynamic and optimized in real-time since it is a constant process of monitoring the state, choosing a reward and changing the action.

FIG. 5 demonstrates the working of the RL-based control logic when running a benchmark. At each time step, the process goes through several stages. In the first stage, the router uses the state to look up the local state-action mapping table for a matching row. In the next stage, the router selects an action (one of all possible operation modes), which has the maximum benefit among all possible actions for the given state, for the next time step. Upon taking the specific action, the NoC system transits to a new state. In last stage, the NoC system provides a reward (a function of the objectives including energy, performance, reliability, etc.) to the router. The reward will be updated according to the new system attributes. Each router will go through the three stages at each time step.

It is noted that CRC and ARQ are both shown and described in the figures. However, it will be appreciated that a router assembly 100 need not have both CRC components and operation and also ARQ components and operation. Thus, for example, the router assembly 100 can only have the CRC components and operation (e.g., the CRC encoder 122 and CRC decoder 124), and not ARQ. Or, the router assembly 100 can only have the ARQ components and operation (e.g., response signal 136, ARQ+ECC decoder 130, ARQ+ECC encoder 132, and output buffers 110), and not CRC.

The system and method of the present invention include operation by one or more processing devices, including operation of the processing core 120, controller 102, as well as the router RC, VA, SA. The processing device can be any suitable device, such as a computer, server, mainframe, processor, microprocessor, PC, tablet, smartphone, or the like. The processing devices can be used in combination with other suitable components, such as a display device (monitor, LED screen, digital screen, etc.), input device (touchscreen, keyboard, pointing device such as a mouse), wireless module (RF, Bluetooth, infrared, WiFi, etc.).

Information and data can be stored in a memory, medium, or storage device (database), such as the unified State-Action Mapping Table 104. The entire process is conducted automatically by the processing device, and without any manual interaction. Accordingly, unless indicated otherwise the process can occur substantially in real-time without any delays or manual action. As used herein, the term "medium" refers to one or more non-transitory physical media that together store the contents described as being stored thereon. Embodiments may include non-volatile secondary storage, read-only memory (ROM), and/or random-access memory (RAM).

It is noted that the invention has been illustrated and described with the output buffer 110, ARQ+ECC Decoder 130, ARQ+ECC encoder 132, CRC encoder 122, CRC decoder 124, controller 102 and processing core 120 being external to the router 150. That is, all of those elements are outside of the router 150 and not included in the processing performed by the router 150. Thus, any suitable router 150 can be utilized including conventional routers 150. And, the router 150 can have its own housing and be separate and discrete from those other elements, which can be contained in their own housing(s).

However, one or more of those components can be provided inside the router 150 or otherwise integral to the router 150 or the operation performed by the router 150. For example the router 150, processing core 120, CRC encoder 122 and CRC decoder 124 can be provided together in a single housing and operate seamlessly as a routing device or routing assembly that replaces a standard router 150. Or, certain operations of those components and/or the router 150 can be shared. For example, the router 150 can utilize the CRC checking during operation of the router 150. Or, the operation of the controller 102 can be combined with and performed by the processing core 120 or the router logic circuitry.

Still further, it is noted that the controller 102, processing core 120, RC, VA, SA are all shown and described as separate modules or device. However, the operation of those elements can all be performed by a single processing device or controller, such as controller 102. And the data stored in the table 104 can be at a separate device or at the controller.

The foregoing description and drawings should be considered as illustrative only of the principles of the invention. The invention may be configured in a variety of ways and is not intended to be limited by the embodiment. Numerous applications of the invention will readily occur to those skilled in the art. Therefore, it is not desired to limit the invention to the specific examples disclosed or the exact construction and operation shown and described. Rather, all suitable modifications and equivalents may be resorted to, falling within the scope of the invention.

The invention claimed is:

1. A network on chip (NoC) reconfigurable router assembly comprising:
a plurality of input ports for receiving a plurality of input data packets from an adjacent upstream reconfigurable router assembly and connected to the adjacent reconfigurable upstream router assembly;
a plurality of discrete input decoders each connected to one of said plurality of input ports, receiving one of the plurality of input data packets from one of said plurality of input ports, and providing a decoded input data packet;
a plurality of discrete input storage buffers, each connected to one of said plurality of input decoders and receiving a decoded input data packet from one of said plurality of input decoders;
an interconnection device receiving the plurality of decoded input data packets from said plurality of input storage buffers, and providing a plurality of interconnection output data packets;
a plurality of discrete output encoders each receiving one of said plurality of interconnection output data packets and providing an encoded output data packet;
a plurality of output ports each receiving the encoded output data packet from one of said plurality of output encoders;
a discrete fault-tolerant controller coupled to each of said plurality of discrete input decoders and each of said plurality of discrete output encoders, said discrete fault-tolerant controller:
transmitting a downstream synchronization control signal to a downstream reconfigurable router to synchronize the plurality of downstream input decoders in the downstream reconfigurable router with said plurality of said output encoders of the current reconfigurable router,
transmitting an upstream synchronization control signal to the upstream reconfigurable router to synchronize said plurality of output encoders in the upstream reconfigurable router with said plurality of input decoders in the current reconfigurable router,
receiving a downstream synchronization control signal from the upstream reconfigurable router to synchronize said plurality of input decoders of the current reconfigurable router with said plurality of output encoders in the upstream router,
receiving an upstream synchronization control signal from the downstream reconfigurable router to synchronize said plurality of output encoders of the current reconfigurable router with said plurality of input decoders in the down stream router, receiving a downstream control signal from an upstream reconfigurable router and disable said plurality of input decoders in response to the received downstream control signal, transmitting a downstream control signal to a downstream reconfigurable router to disable said plurality of input decoders in said downstream reconfigurable router, transmitting an upstream control signal to the upstream reconfigurable router to disable said output encoders of the upstream reconfigurable router, and receiving an upstream control signal from a downstream reconfigurable router and disabling said output encoders in response to the received upstream control signal, a discrete processing device configured to select one of a plurality of fault-tolerant operation modes based on reinforcement machine-learning optimization, and controlling operation of said plurality of input decoders and said plurality of output encoders based on the selected fault-tolerant operation mode, wherein the plurality of fault-tolerant operation modes comprise Cyclic Redundancy Check (CRC), Automatic Retransmission Query (ARQ), Single-bit Error Correction and Double-bit Error Detection (SECDED), and Double-bit Error Correction Triple-bit Error Correction (DECTED);

said processing device further configured to dynamically determine a state of said reconfigurable router assembly based on attributes of said plurality of input ports, said plurality of output ports, said error correction code (ECC) encoder, said error correction code (ECC) decoder, output buffers, or acknowledgement response;

said processing device further configured to dynamically disable at least one of said plurality of input decoders or at least one of said plurality of output encoders in response to the determined action to operate in the selected fault-tolerant operation mode, and dynamically enable at least one of said plurality of input decoders or at least one of said plurality of output encoders in response to the determined action to operate in the selected fault-tolerant operation mode.

2. The NoC reconfigurable router assembly of claim 1, further comprising:

an error checking encoder encoding source and providing a first encoded error checking output data packet;

an error checking input storage buffer receiving the first encoded error checking output data packet from said error checking encoder data packet;

said interconnection device receiving the first error checking encoded output data packet from said error checking input storage buffer and receiving a second error checking encoded output data packet from the adjacent upstream reconfigurable router assembly; and an error checking decoder connected to said interconnection device, receiving the second error checking encoded output data packet, decoding the second error checking encoded output data packet, determining if the second error checking encoded output data packet has error, and sending a retransmit request to the adjacent upstream reconfigurable router assembly to retransmit the plurality of input data packets if the second error checking encoded output data packet has error;

said plurality of output encoders receiving the first error checking encoded output data packet from said interconnection device.

3. The NoC reconfigurable router assembly of claim 2, wherein said error checking encoder comprises a Cyclic Redundancy Check (CRC) encoder, and said error correction decoder comprises a CRC decoder.

4. The NoC reconfigurable router assembly of claim 1, wherein said interconnection device comprises a crossbar.

5. The NoC reconfigurable router assembly of claim 1, wherein said plurality of input decoders comprise Automatic Retransmission Query (ARQ) protocol with error correction code (ECC) (ARQ+ECC) decoders, and said plurality of output encoders comprise ARQ+ECC encoders.

6. The NoC reconfigurable router assembly of claim 1, further comprising a processing device sending an acknowledgment request to the adjacent upstream reconfigurable router assembly and receiving said acknowledgement response from an adjacent downstream reconfigurable router assembly.

7. The NoC reconfigurable router assembly of claim 6, further comprising a plurality of output buffers each receiving one of the plurality of second interconnection output data packets, said processing device further retransmitting the plurality of second interconnection output data packets from said plurality of output buffers in response to receiving a negative acknowledgement response from the adjacent downstream reconfigurable router assembly.

8. The NoC reconfigurable router assembly of claim 1, further comprising a plurality of output buffers each receiving one of the plurality of second interconnection output data packets, and further comprising a processing device further receiving a retransmit request from an adjacent downstream reconfigurable router assembly and retransmitting the plurality of second interconnection output data packets from said plurality of output buffers in response to the retransmit request.

9. The NoC reconfigurable router assembly of claim 1, wherein:

the reconfigurable router assembly further comprising:
a switch that enables and disables said plurality of output encoders and plurality of input decoders in response to an activation from the fault-tolerant controller.

10. The NoC reconfigurable router assembly of claim 9, said processing device delaying at least one cycle before receiving input data packets.

11. The NoC reconfigurable router assembly of claim 1, wherein said plurality of input decoders and said plurality of output encoders perform single-bit error correction and double-bit error detection (SECDED).

12. The NoC reconfigurable router assembly of claim 1, said action comprising fault-tolerant methodology using ARQ+CRC error detection.

13. The NoC reconfigurable router assembly of claim 1, said action comprising fault-tolerant methodology using SECDED error correction.

14. The NoC reconfigurable router assembly of claim 1, said action comprising fault-tolerant methodology using SECDED error correction with proactive retransmission method.

15. The NoC reconfigurable router assembly of claim 1, said action comprising fault-tolerant methodology using relaxed transmission method.

16. The NoC reconfigurable router assembly of claim 1, wherein said attributes comprise usage of said plurality of input storage buffers, usage of said plurality of input ports, usage of said plurality of output ports, rate of received negative acknowledgement response, rate of transmitted negative acknowledgement response, and/or temperature.

17. The NoC reconfigurable router assembly of claim 1, further comprising a state-action table associating each state with an associated action.

18. The NoC reconfigurable router assembly of claim 1, said processing device selecting the action with maximum benefit according to a reward that is a function of objectives includes energy, performance, and reliability.

19. The NoC reconfigurable router assembly of claim 1, wherein said plurality of input storage buffers each comprise a register.

20. The NoC reconfigurable router assembly of claim 1, wherein said processing device selects an operation mode according to machine learning algorithms including supervised learning or a reinforcement learning algorithm.

21. The NoC reconfigurable router assembly of claim 17, wherein the state-action table is stored in the fault-tolerant controller.

22. A Network on Chip (NoC) reconfigurable router assembly comprising:
   a plurality of input ports for receiving a plurality of input data packets from an upstream reconfigurable router assembly;
   a plurality of discrete input decoders each receiving one of the plurality of input data packets from one of said plurality of input ports and providing a decoded input;
   a plurality of input storage buffers, each receiving a decoded input from one of said plurality of input decoders;
   an interconnection device receiving the plurality of decoded input data packets from said plurality of input storage buffers, and providing a plurality of interconnection output data packets;
   a plurality of discrete output encoders each receiving one of said plurality of interconnection output data packets and providing an encoded output data packet;
   a plurality of output ports each receiving the encoded output data packet from one of said plurality of output encoders;
   an error checking encoder encoding source and providing a first encoded error checking output data packet;
   an error checking input storage buffer receiving the first encoded error checking output data packet from said error checking encoder;
   said interconnection device receiving the first error checking encoded output data packet from said error checking input storage buffer and receiving a second error checking encoded output data packet from the upstream reconfigurable router assembly;
   an error checking decoder connected to said interconnection device, receiving the second error checking encoded output, decoding the second error checking encoded output data packet, determining if the second error checking encoded output data packet has error, and sending a retransmit request to the upstream reconfigurable router assembly to retransmit the plurality of input data packets if the second error checking encoded output data packet has error;
   said plurality of output encoders receiving the first error checking encoded output data packet from said interconnection device;
   a discrete fault-tolerant controller coupled to each of said plurality of discrete input decoders and each of said plurality of discrete output encoders, said discrete fault-tolerant controller:
      transmitting a downstream synchronization control signal to a downstream reconfigurable router to synchronize the plurality of downstream input decoders in the downstream reconfigurable router with said plurality of said output encoders of the current reconfigurable router,
      transmitting an upstream synchronization control signal to the upstream reconfigurable router to synchronize said plurality of output encoders in the upstream reconfigurable router with said plurality of input decoders in the current reconfigurable router,
      receiving a downstream synchronization control signal from the upstream reconfigurable router to synchronize said plurality of input decoders of the current reconfigurable router with said plurality of output encoders in the upstream router,
      receiving an upstream synchronization control signal from the downstream reconfigurable router to synchronize said plurality of output encoders of the current reconfigurable router with said plurality of input decoders in the down stream router,
      receiving a downstream control signal from an upstream reconfigurable router and disable said plurality of input decoders in response to the received downstream control signal,
      transmitting a downstream control signal to a downstream reconfigurable router to disable said plurality of input decoders in said downstream reconfigurable router, transmitting an upstream control signal to the upstream reconfigurable router to disable said output encoders of the upstream reconfigurable router, and
      receiving an upstream control signal from a downstream reconfigurable router and disabling said output encoders in response to the received upstream control signal, and
   a discrete processing device configured to select one of a plurality of fault-tolerant operation modes based on reinforcement machine-learning optimization, and controlling operation of said plurality of input decoders and said plurality of output encoders based on the selected fault-tolerant operation mode, wherein the plurality of fault-tolerant operation modes comprise Cyclic Redundancy Check (CRC), Automatic Retransmission Query (ARQ), Single-bit Error Correction and Double-bit Error Detection (SECDED), and Double-bit Error Correction Triple-bit Error Correction (DECTED);
   said processing device further configured to dynamically determine a state of said reconfigurable router assembly based on attributes of said plurality of input ports, said plurality of output ports, said error correction code (ECC) encoder, said error correction code (ECC) decoder, said buffers, or acknowledgement response;
   said processing device further configured to dynamically disable at least one of said plurality of input decoders or at least one of said plurality of output encoders in response to the determined action to operate in the selected fault-tolerant operation mode, and dynamically enable at least one of said plurality of input decoders or at least one of said plurality of output encoders in response to the determined action to operate in the selected fault-tolerant operation mode.

23. The NoC reconfigurable router assembly of claim 22, wherein said error checking encoder comprises a Cyclic Redundancy Check (CRC) encoder, and said error correction decoder comprises a CRC decoder.

24. The NoC reconfigurable router assembly of claim 1, wherein each of the plurality of fault-tolerant operation modes has a fault-tolerant capability, retransmission traffic, latency and energy efficiency.

25. The NoC reconfigurable router assembly of claim 1, wherein the machine-learning optimization balances design trade-offs and simultaneously optimizes parameters including power, latency and error rate.

26. The NoC reconfigurable router assembly of claim 1, wherein the downstream and upstream synchronization control signals synchronize the error correction codes used in said plurality of output encoders and said plurality of input decoders of the current router, downstream router, and upstream router.

* * * * *